United States Patent
Covarel et al.

(10) Patent No.: US 6,775,179 B2
(45) Date of Patent: Aug. 10, 2004

(54) MEMORY WITH SHARED BIT LINES

(75) Inventors: Hervé Covarel, Montbar (FR); Sébastien Gaubert, Montbonnot-Saint-Martin (FR)

(73) Assignee: Dolphin Integration, Meylan (FR)

(*) Notice: Subject to any disclaimer, the term of this patent is extended or adjusted under 35 U.S.C. 154(b) by 0 days.

(21) Appl. No.: 10/232,256

(22) Filed: Aug. 30, 2002

(65) Prior Publication Data

US 2003/0063501 A1 Apr. 3, 2003

(30) Foreign Application Priority Data

Aug. 31, 2001 (FR) .......................................... 01 11298

(51) Int. Cl.$^7$ .............................................. G11C 11/00
(52) U.S. Cl. ........................... 365/154; 365/51; 365/63; 365/190
(58) Field of Search ................................. 365/154, 190, 365/51, 63, 72, 230.03

(56) References Cited

U.S. PATENT DOCUMENTS

| | | | |
|---|---|---|---|
| 5,089,992 A | 2/1992 | Shinohara | 365/51 |
| 5,276,650 A | 1/1994 | Kubota | 365/207 |
| 5,379,246 A * | 1/1995 | Nogami | 365/51 |
| 5,418,740 A | 5/1995 | Sasaki | 365/154 |

* cited by examiner

Primary Examiner—Tan T. Nguyen
(74) Attorney, Agent, or Firm—Duane Morris LLP

(57) ABSTRACT

A memory block comprising a network of memory cell rows and columns, each memory cell being connected to a word line and at least one bit line, in which at least two word lines are associated with each row, and at least two adjacent columns share at least one same bit line, two memory cells of the two adjacent columns belonging to a same row being connected to different word lines.

20 Claims, 7 Drawing Sheets

MEMORY WITH SHARED BIT LINES

This application claims priority of the earlier filing date, under 35 U.S.C. 119, of French Patent Application No. 01/11298, filed on Aug. 31, 2001.

BACKGROUND OF THE INVENTION

1. Field of the Invention

The present invention generally relates to memories comprising a network of memory cell rows and columns and the associated memory cells.

2. Discussion of the Related Art

FIG. 1 schematically shows a cell of a static memory of random access type (SRAM) of conventional structure. The memory cell comprises inverters 1, 2, connected in antiparallel. The respective inputs of inverters 1, 2 are connected to respective bit lines BL, $\overline{BL}$ via switches 3, controlled by a row selection signal conveyed by a word line WL. Each inverter 1, 2, is powered by a high voltage VDD and a low voltage GND, currently the ground.

To write an information in the memory cell, a voltage VDD is applied on one of bit lines BL or $\overline{BL}$, and a voltage GND is applied on the other one. Then, switches 3 are turned on to set the state of the inputs and outputs of inverters 1 and 2. Switches 3 are then turned off and the state of the signals across inverters 1 and 2 is maintained.

To read an information from the memory cell, each bit lines BL and $\overline{BL}$ is precharged to a voltage ranging between voltages VDD and GND, after which switches 3 are turned on so that the voltages on the bit lines vary according to the state of the signals across inverters 1 and 2. A sense amplifier (not shown) connected to the bit lines provides a binary information in relation with the information kept in the memory cell.

Inverter 1 comprises a P-channel MOS transistor, PI1, in series with an N-channel MOS transistor, NI1. The source of transistor PI1 is connected to voltage VDD and the source of transistor NI1 is connected to voltage GND. The drains of transistors PI1 and NI1 are connected at a point O2. The gates of transistors PI1 and NI1 are also connected at a point O1.

Similarly, inverter 2 comprises transistors PI2 and NI2 connected like transistors PI1 and NI1, the gates of transistors PI2 and NI2 being connected to terminal O2 and the common drains of transistors PI2 and NI2 being connected to terminal O1. Switches 3 are formed of MOS transistors M1 and M2, generally with an N channel.

FIG. 2 shows a portion of a conventional SRAM, each memory cell being represented by a reference block MCij. 8 cells have been shown, with i varying from 0 to 1 and j varying from 0 to 3. Conventionally, a single word line (WLi, i varying from 0 to 1) corresponds to a memory cell row and two bit lines (BLj and $\overline{BLj}$, j varying from 0 to 3) correspond to a memory cell column.

In such a memory, upon writing or reading of data into or from a memory cell, it is necessary to select, with one of word lines WL0, WL1, all the memory cells in the row where the searched memory cell is present. This results in a consumption which increases with the number of memory cells forming each row.

FIG. 3 shows a memory in which four word lines are associated with each row, each word line being connected to one memory cell out of four. Generally, if a memory comprises N word lines per row, the number of memory cells simultaneously selected by a word line will be divided by N. By reducing the number of memory cells selected upon each write and/or read operation, the memory consumption is decreased.

However, the increase in the number of word lines per row causes an increase in the memory surface area.

As an illustration, FIG. 4 schematically shows an example of a topology of cell MC01 of the memory of FIG. 3, in which the electric circuit of FIG. 1 and the additional word lines are formed in a technology with one polysilicon level and three metallization levels. Other polysilicon and metallization levels may be present and used.

The surfaces delimited by a thin line correspond to active areas of the semiconductor substrate or to polysilicon strips deposited on the substrate and corresponding to the gates of MOS transistors. Although the view is not drawn to scale, the relative dimensions and positions of each region are kept to show the real bulk of the integrated circuit. The double lines correspond to metal strips of level one. The horizontal thick black lines correspond to metal strips of level two, and the vertical thick black lines correspond to metal strips of level three. The crosses show contacts connecting, through the insulating layers located between the metallization levels and the polysilicon level, metal strips to active areas or to polysilicon strips or vias connecting, through the insulating layers located between the metallization levels, metal strips to other metal strips. For clarity, the metal strips are not shown with surface areas proportional to the surface areas of the active areas. However, the position of each line conforms to the real position of the corresponding metal strip in the integrated circuit.

In FIG. 4, the different elements shown in FIG. 1 can be seen. The gate, source, and drain regions of the various transistors are designated with letter G, S, or D followed with the transistor reference.

Gates GM1 and GM2 of the respective MOS transistors M1 and M2 correspond to portions of polysilicon strip 10. Active area 11 corresponds to MOS transistor M1, to MOS transistor NI2, and to the connection between these transistors. Similarly, active area 12 corresponds to MOS transistor M2, to MOS transistor NI1, and to the connection between these transistors. The respective gates GNI2 and GPI2 of MOS transistors NI2 and PI2 correspond to portions of polysilicon strip 13. Similarly, the respective gates GNI1 and GPI1 of MOS transistors NI1 and PI1 correspond to portions of polysilicon strip 14.

The different metal strips of level one, two, and three are used to connect the active areas and the polysilicon strips to obtain the equivalent electric diagram shown in FIG. 1. In particular, the word line connected to gates GM1, GM2 of transistors M1 and M2 is, in the present example, word line WL01 corresponding to a horizontal metal strip of level two which is connected to polysilicon strip 10 via a vertical metal strip 17 of level one.

The topology of such a cell imposes for word lines WL00, WL01, WL02, and WL03 to correspond to horizontal metal strips of level two, while word lines BL1 and $\overline{BL1}$ correspond to vertical metal strips of level three. To enable passing of the word lines, it is necessary to increase the surface area of each cell and thus the total surface area of the memory. In a manufacturing technology in which the smallest pattern has a length of 0.18 $\mu$m, a width $\Delta x$ of 2.16 $\mu$m, a height $\Delta y$ of 5.24 $\mu$m, and a surface area of 11.32 $\mu m^2$ are obtained for the memory cell of FIG. 4. As a comparison, a memory cell of similar topology but with a single word line per row would have a width $\Delta x$ of 2.16 $\mu$m, a height $\Delta y$ of 3.6 $\mu$m, and a surface area of 7.78 $\mu m^2$.

SUMMARY OF THE INVENTION

The present invention aims at providing an alternative memory architecture and associated memory cell topology.

The present invention aims at providing a memory having a surface area which does not vary when the number of word lines per row increases. In particular, the present invention aims at providing a memory, with several word lines per row, having a general surface area smaller than the surface area of an equivalent memory of conventional structure with a single word line per row or of the same order.

To achieve these objects, the present invention provides a memory block comprising a network of memory cell rows and columns, each memory cell being connected to a word line and two bit lines, in which at least two word lines are associated with each row, and at least two adjacent columns share the two bit lines, two memory cells of the two adjacent columns belonging to a same row being connected to different word lines.

According to an embodiment of the present invention, the memory cells are formed in a semiconductor substrate, and comprise transistors, the gates of which correspond to a same polysilicon level and the interconnections of which are formed by conductive strips distributed on three levels, the conductive strips forming the word lines being of level three, and a conductive strip forming a bit line being of level two.

According to an embodiment of the present invention, each memory cell, arranged between two other memory cells of the same row, is connected to two supply lines of different voltages, each supply line being shared between the memory cell and one of the adjacent memory cells, and placed on a common edge between the two memory cells.

According to an embodiment of the present invention, the supply lines are of level two, parallel to the bit line, and orthogonal to the word lines.

According to an embodiment of the present invention, each memory cell, arranged between two other memory cells of the same row, comprises four N-channel MOS transistors having their sources and drains formed in a same active area and aligned along a common edge between the memory cell and one of the adjacent memory cells.

According to an embodiment of the present invention, each memory cell, arranged between two other memory cells of the same row, comprises two P-channel MOS transistors having their sources and drains aligned along a common edge between the memory cell and one of the adjacent memory cells.

According to an embodiment of the present invention, the memory cells comprise a conductive strip of level two, perpendicular to the word lines, connected to one of the word lines and to two MOS transistors.

According to an embodiment of the present invention, each memory cell comprises a transistor connected to the bit line, and a metal strip of level one connecting a transistor to a bit line located on an adjacent cell of the same row.

According to an embodiment of the present invention, each memory cell, arranged between the two other memory cells of the same column, comprises a metal strip of level one, connecting a transistor to a supply line or to a bit line, the metal strip being shared between the memory cell and one of the adjacent memory cells, and placed on a common edge between the two memory cells.

According to an embodiment of the present invention, at least one memory cell comprises a conductive strip of level two, parallel to the bit line and located above the P-channel MOS transistors.

The present invention also provides a memory formed of a network of rows and columns of memory blocks in which the word lines associated with memory cell rows of memory blocks of a same memory block row are common, the bit lines associated with memory cell columns of memory blocks of a same memory block column are separate, and comprising, per memory block column, at least one additional bit line extending in the column direction and being likely to be connected to one of the adjacent bit lines.

The foregoing objects, features and advantages of the present invention, will be discussed in detail in the following non-limiting description of specific embodiments in connection with the accompanying drawings.

DETAILED DESCRIPTION

For clarity, same elements are designated with same references in the different drawings.

Figure 1:
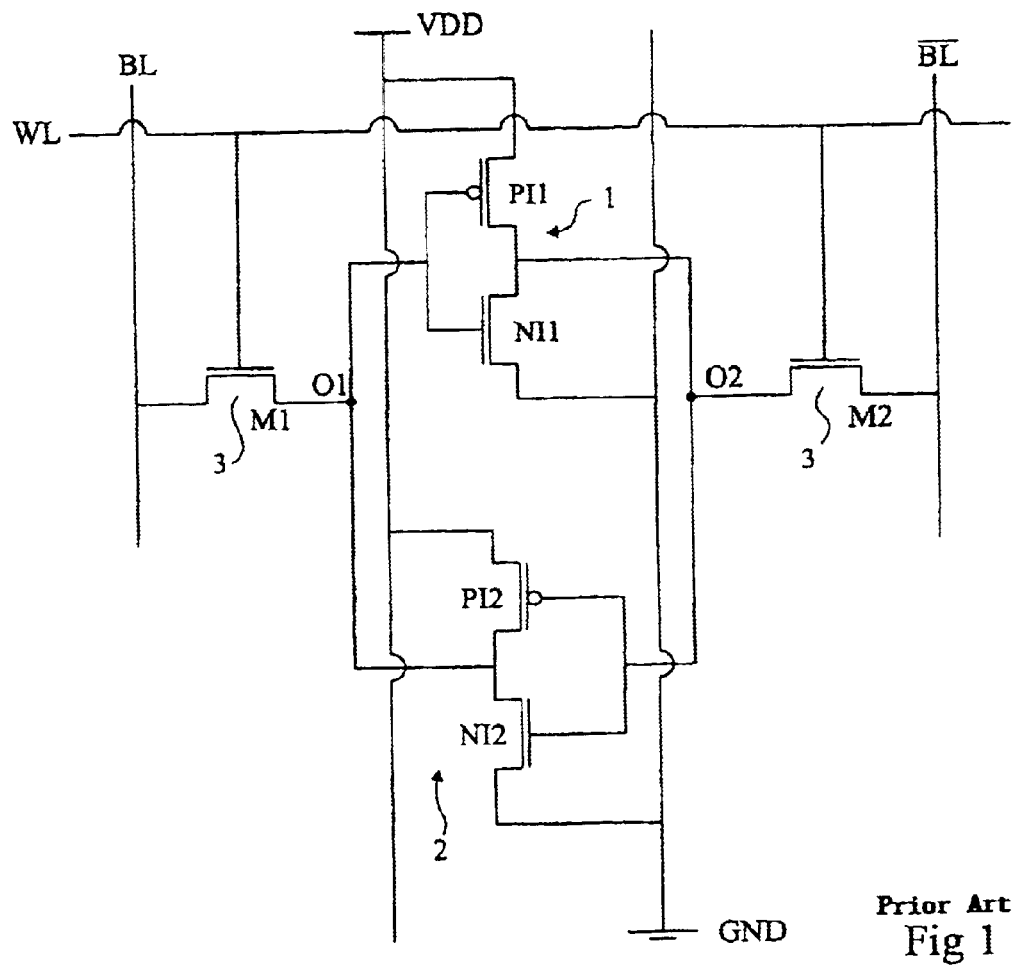
FIG. 1, previously described, schematically shows a conventional SRAM cell.
Figure 2:
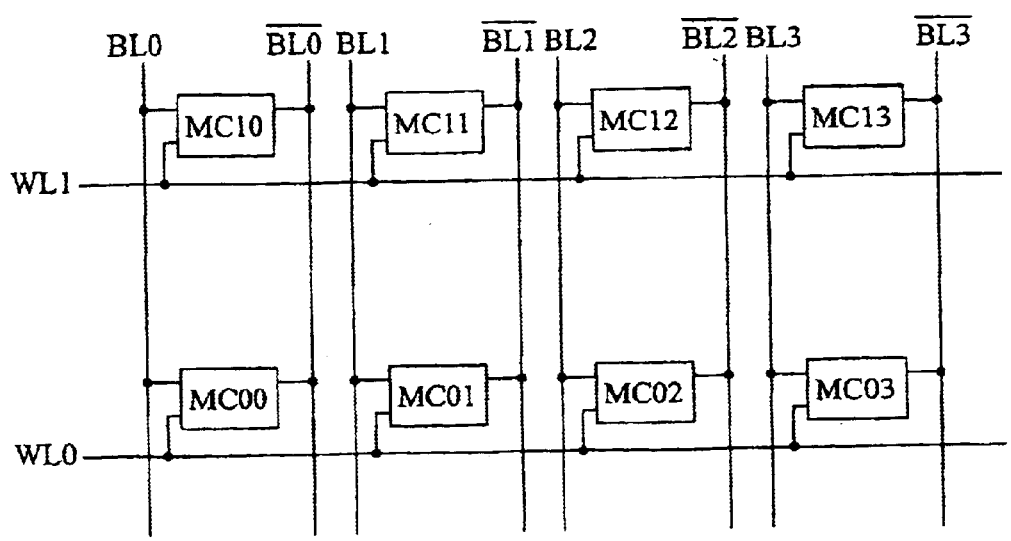
FIG. 2, previously described, schematically shows a conventional SRAM with one word line per row.
Figure 3:
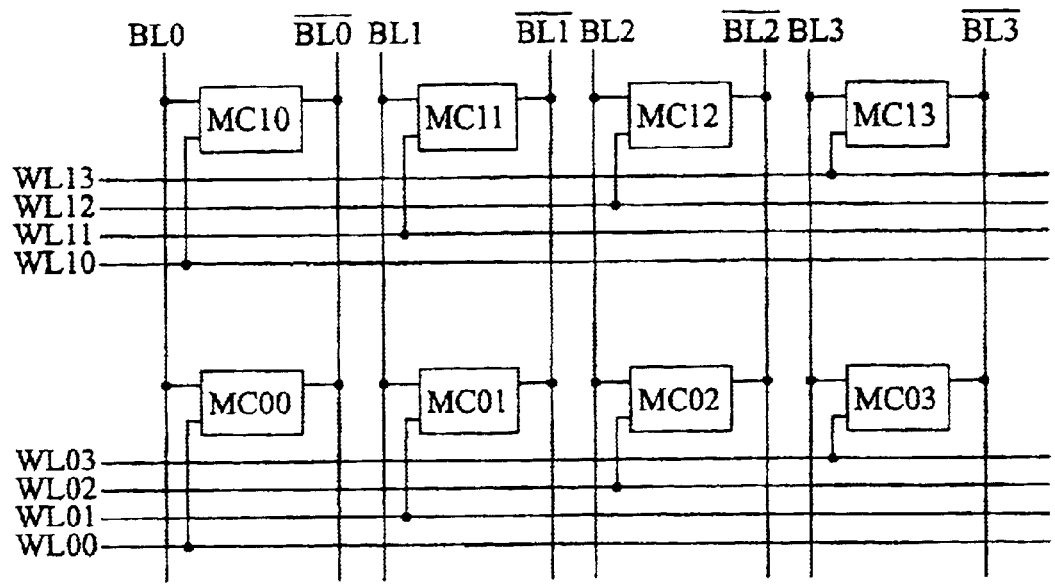
FIG. 3, previously described, schematically shows a conventional SRAM with four word lines per row.
Figure 5:
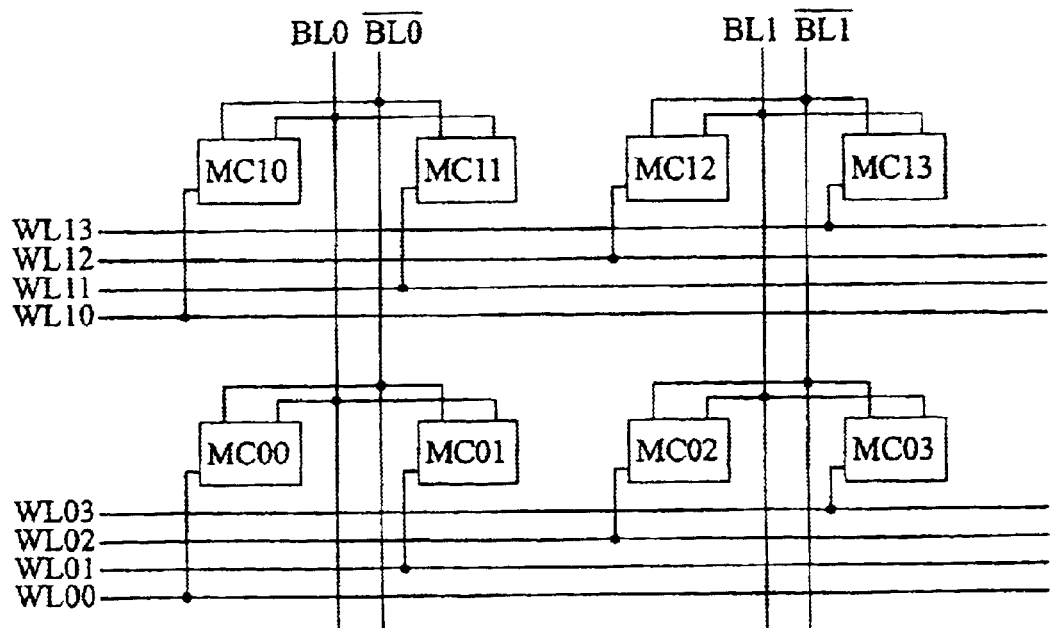
FIG. 5 schematically shows a SRAM according to the present invention with four word lines per row.

FIG. 5 shows a SRAM with four word lines per row. The columns share, two by two, two bits lines, BL0–$\overline{BL0}$ and BL1–$\overline{BL1}$. Each bit line is thus connected, for each row, to the switches of two adjacent memory cells. Thus, for example, when memory cell MC00 is selected by word line WL00, write and/or read operations can be performed in the memory cell directly from bit lines BL0 and $\overline{BL0}$ since memory cell MC01, also connected to these bit lines, is not selected.

Figure 4:
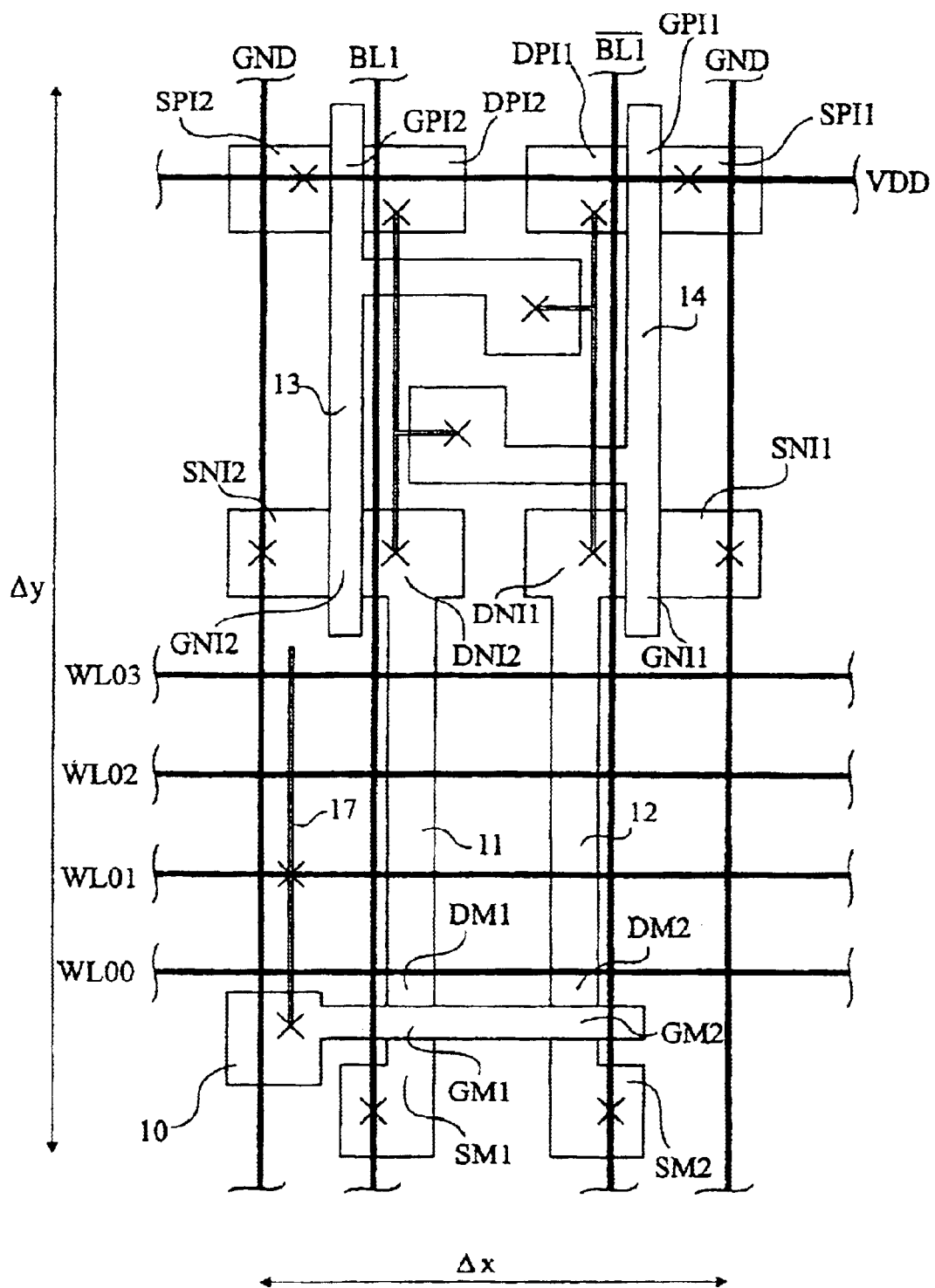
FIG. 4, previously described, schematically shows an example of a conventional topology of a cell of a SRAM with four word lines per row.
Figure 6:
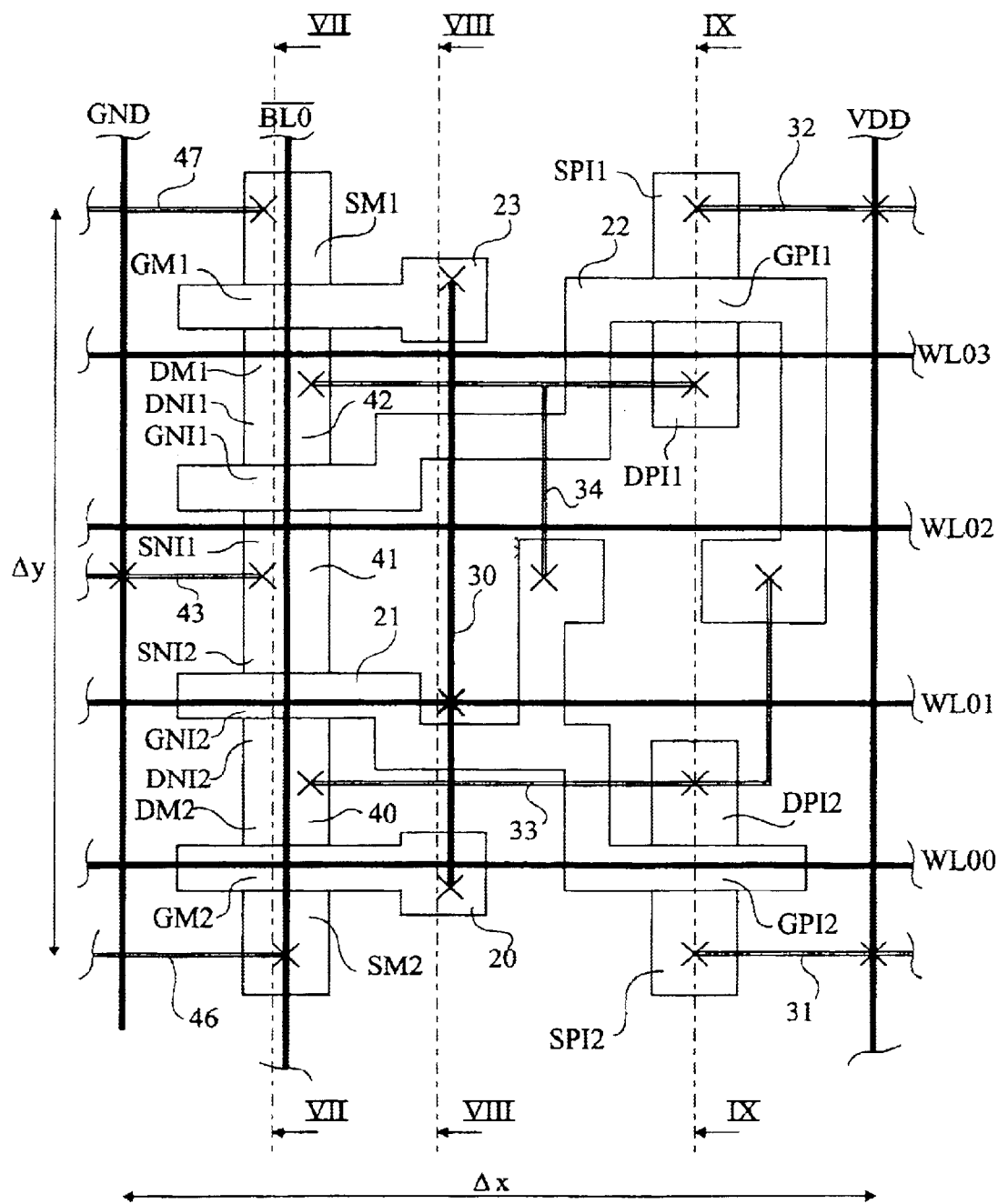
FIG. 6 shows an embodiment of a memory cell according to the present invention.

FIG. 6 shows a simplified view of an example of topology of memory cell MC01 of FIG. 5. As for the memory cell of FIG. 4, the technology used to form the electric circuit is a technology with one polysilicon level and three metallization levels, knowing that other polysilicon and metallization levels may be present and used. The same conventions as for FIG. 4 are used, except that, in FIG. 6, the horizontal thick black lines correspond to metal strips of level three and the vertical thick black lines correspond to metal strips of level two.

The four N-channel MOS transistors M1, NI1, NI2, and M2 are formed, in this order, in a same vertical active area strip located to the left of the drawing. P-channel MOS transistors PI1 and PI2 are formed in independent active areas located to the right of the drawing.

Gate GM2 of MOS transistor M2 corresponds to a portion of a polysilicon strip 20. Gates GNI2 and GPI2 of MOS transistors NI2 and PI2 correspond to portions respectively located at the opposite ends of a polysilicon strip 21. Gates GNI1 and GPI1 of transistors NI1 and PI1 correspond to portions of a polysilicon strip 22. Finally, gate GM1 of MOS transistor M1 corresponds to a portion of a polysilicon strip 23.

Supply lines VDD and GND are formed of vertical metal strips of level two which laterally delimit the memory cell. Supply line GND is arranged in the immediate vicinity of the active area comprising the N-channel MOS transistors.

Bit line $\overline{BL0}$ corresponds to a vertical metal strip of level two substantially located above aligned transistors M2, NI2, NI1, and M1. A vertical metal strip 30 of level two, placed between bit line and supply line VDD is connected at its ends, by contacts and vias, to polysilicon strips 20 and 23, and thus to respective gates GM2, GM1 of MOS transistors M2 and M1. Metal strip 30 is also connected by a via to a word line WL01.

Word lines WL00 to WL03 correspond to horizontal metal strips of level three and are uniformly distributed on the memory cell. This uniform distribution is possible due to the fact that no other connection uses the third metallization level.

MOS transistors PI2 and PI1 are vertically arranged and substantially aligned in an area delimited by vertical metal strip 30 and supply line VDD. Source SPI2 of transistor PI2 is arranged towards the bottom of the memory cell, and source SPI1 of transistor PI1 is arranged towards the top of the memory cell. Source SPI2 of MOS transistor PI2 is connected to vertical supply line VDD via a contact and a via and a horizontal metal strip 31 of level one. Similarly, source SPI1 of MOS transistor PI1 is connected to supply line VDD via a contact and a via and a horizontal metal strip 32 of level one.

Drains DM2 and DNI2 of MOS transistors M2 and NI2 are connected to a metal strip 33 of level one, itself connected both to drain DPI2 of MOS transistor PI2 and to polysilicon strip 22. Drains DM1 and DNI1 of MOS transistors M1 and NI1 are connected to a metal strip 34 of level one, itself connected both to drain DPI1 of MOS transistor PI1 and to polysilicon strip 21.

Figure 7:
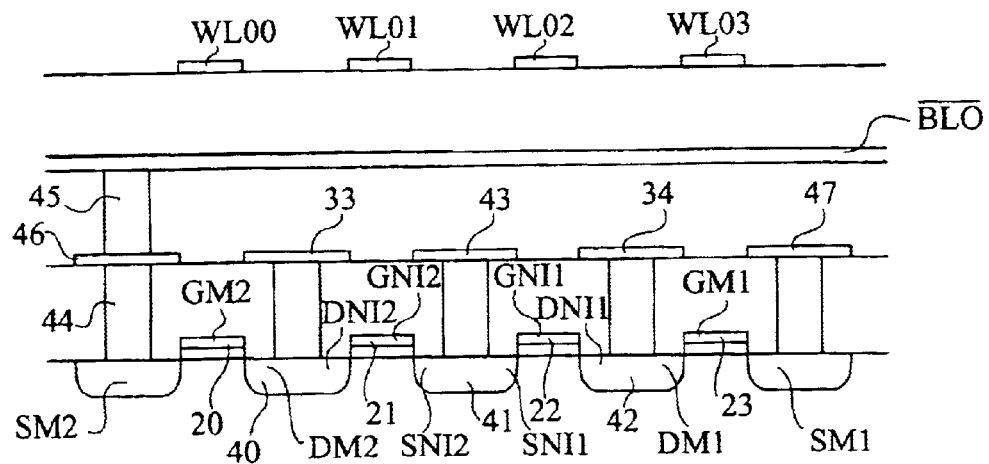
FIG. 7 shows a simplified cross-section view of FIG. 6 along line VII—VII.

FIG. 7 shows a cross-section view of FIG. 6 along line VII—VII which extends along the active area containing the N-channel MOS transistors of the memory cell. Drain DM2 of MOS transistor M2 and drain DNI2 of MOS transistor NI2 correspond to a same region 40. Similarly, source SNI2 of MOS transistor NI2 and source SNI1 of MOS transistor NI1 correspond to a same region 41. Finally, drain DNI1 of MOS transistor NI1 and drain DM1 of MOS transistor M1 correspond to a same region 42.

Sources SNI2, SNI1 of respective MOS transistors NI2, NI1, are connected to vertical supply line GND via a contact, a via and a horizontal metal strip 43 of level one; Source SM2 of MOS transistor M2 is connected to vertical bit line $\overline{BL0}$ via a contact 44 and a via 45 which join on a horizontal metal strip 46 of level one.

Source SM1 of MOS transistor M1 is connected to a bit line BL0 (not shown) arranged on the adjacent memory cell located to the left of the memory cell shown in FIG. 6, via a contact, a via, and a horizontal metal strip 47 of level one extending on the adjacent cell. The adjacent memory cell can be obtained by 180° rotation (except for the via connected to word line WL01) or by symmetry with respect to supply line GND (except for via 45 and for the via connected to word line WL01) of the shown memory cell, and is crossed by a vertical bit line BL0 of level two adjacent to supply line GND, which delimits the border between two memory cells.

Figure 8:
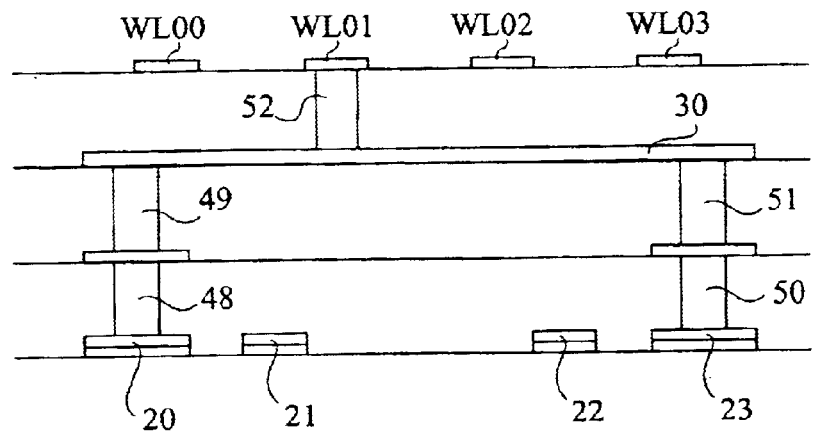
FIG. 8 shows a simplified cross-section view of FIG. 6 along line VIII—VIII.

FIG. 8 shows a cross-section view of FIG. 6 according to line VIII—VIII. As can more clearly be seen in this drawing, horizontal polysilicon strip 20 is connected to one of the ends of vertical metal strip 30 of level two by a contact 48 and a via 50. Similarly, horizontal polysilicon strip 23 is connected to the other end of metal strip 30 by a contact 50 and a via 51. Metal strip 30 substantially extends under the four horizontal strips of level three corresponding to word lines WL00 to WL03, and is connected to word line WL01 by a via 52.

Figure 9:
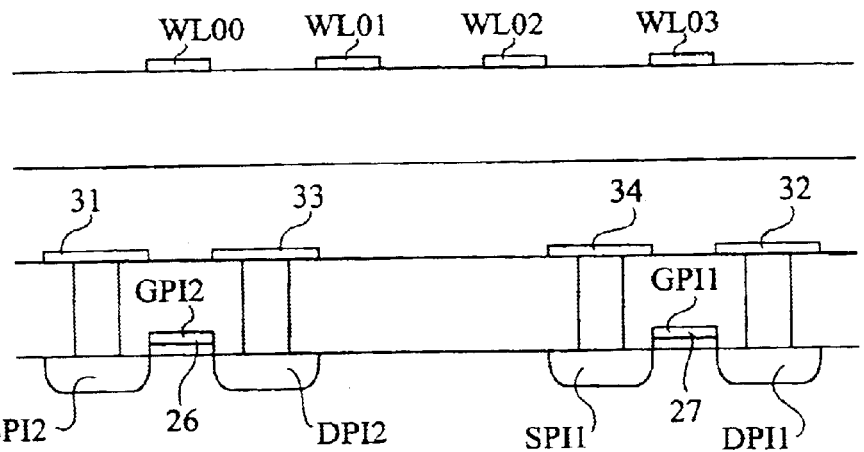
FIG. 9 shows a simplified cross-section view of FIG. 6 along line IX—IX.

FIG. 9 shows a cross-section view of FIG. 6 along line IX—IX. Source SPI2 of MOS transistor PI2 can be seen to be connected, by a contact, to horizontal metal strip 31 of level one, and drain DPI1 of MOS transistor PI1 can be seen to be connected, by a contact, to horizontal metal strip 32 of level one. Drain DPI2 of MOS transistor PI2 is connected, by a contact, to metal strip 33 of level one, and source SPI1 of MOS transistor PI1 is connected, by a contact, to metal strip 34 of level one.

As clearly appears from FIGS. 7, 8, and 9, only horizontal word lines WL00 to WL03 take up the third metallization level. Indeed, supply lines GND, VDD, bit line $\overline{BL0}$ and metal strip 30 all correspond to vertical metal strips taking up the second metallization level.

The fact of arranging sources SNI2 and SNI1 of respective MOS transistors NI2 and NI1 and sources SPI1 and SPI2 of respective MOS transistors PI1 and PI2 close to the lateral edges of the cell enables placing the metal strips of supply lines VDD and GND on the lateral edges of the cell. Supply line VDD can thus be put in common with the memory cell of the same row located to the right of the shown cell, and supply line GND can be put in common with the memory cell of the same row located to the left of the shown cell. Further, sources SM2 and SM1 of respective MOS transistors M2 and M1, and sources SPI1 and SPI2 of respective MOS transistors PI1 and PI2 being close to the upper or lower edge of the cell, horizontal metal strips 31, 32, 46, 47 of level one can be placed on the upper or lower edges of the memory cell. Metal strips 31 and 46 and the associated vias and contacts can thus be put in common with the memory cell of the same column located under the shown cell, and metal strips 32 and 47 and the associated via and contacts can be put in common with the memory cell of the same column located above the shown cell.

Upon forming of a memory, it is possible to divide the memory into memory sub-blocks. Each memory sub-block for example corresponds to a number of memory cell rows, since the bit lines of the memory cells of a sub-block are not connected to the corresponding bit lines of an adjacent sub-block.

Figure 10:
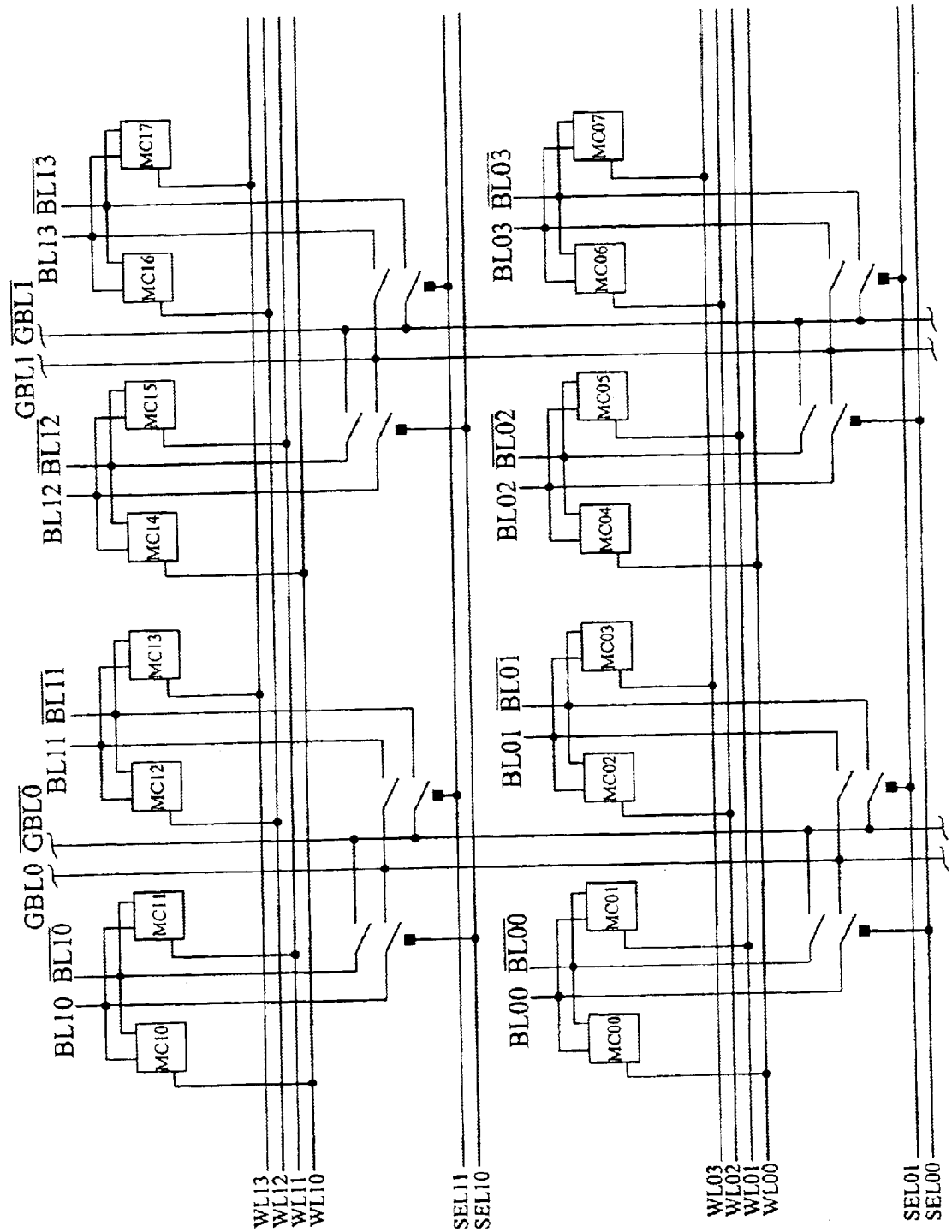
FIG. 10 schematically shows a SRAM divided into sub-blocks.

FIG. 10 schematically shows as an example a memory architecture with four word lines per row divided into memory sub-blocks. Although the drawing only shows one row per sub-block, it should be clear that each sub-block comprises a great number of rows.

The memory comprises vertical global bit lines GBL0, $\overline{GBL0}$, GBL1, $\overline{GBL1}$ parallel to the bit lines of the memory cells enabling connecting the bit lines of all sub-blocks to the read and write amplifiers, for example, as shown in FIG. 10, by extending over all the memory sub-blocks. In the present example, two global bit line can be connected to the four bit lines of each sub-block associated with four adjacent memory cells. The connection is performed at the level of multiplexing cells via switches controlled by selection lines SEL00, SEL01, SEL10, SEL11. Thus, in a read or write operation in a determined memory cell, only the two bit lines associated with this memory cell are connected to the global bit lines. The charge seen by the read and write amplifiers is thus limited to the charge present on the bit lines of a sub-block and to the charge present on the global bit lines.

The addition of global bit lines GBL0, $\overline{\text{GBL0}}$, GBL1, $\overline{\text{GBL1}}$ may, with conventional memory cell technologies, cause an increase in the memory surface area or require use of additional metallization levels. On the contrary, with the memory cell topology according to the present invention, the addition of global bit lines does not modify the memory surface area.

Figure 11:
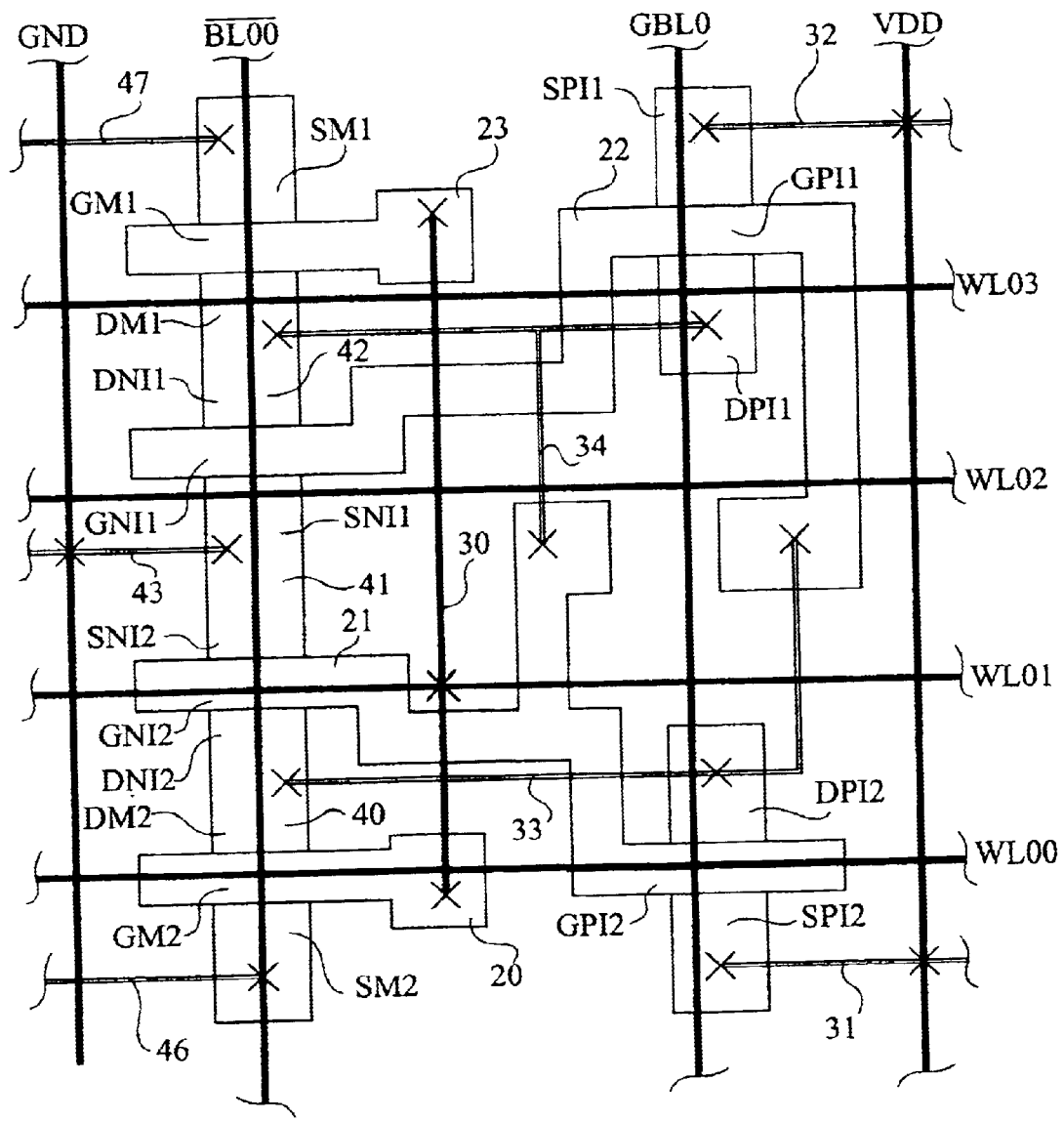
FIG. 11 shows an alternative of the memory of FIG. 6.

FIG. 11 shows an example of the topology of cell MC01 of the memory of FIG. 7. The topology corresponds to that of FIG. 6 to which one vertical global bit line GBL0 of level two has been added. This vertical global bit line GBL0 is placed between vertical metal strip 30 of level two and vertical supply line VDD of level two. It is possible to add global bit line GBL0 without modifying the topology of the rest of the memory cell since the memory cell according to the present invention, for a 0.18-$\mu$m technology, has a width $\Delta x$ of 2.58 $\mu$m, due to the arrangement of the active areas and of the polysilicon strips, that is, more than the width of 2.16 $\mu$m of the memory cell of FIG. 4, and this, for a same number of vertical metal strips (of level two in the present invention, and of level three for the memory cell of FIG. 4).

A cell height $\Delta y$ of 2.88 $\mu$m is obtained, smaller than the 5.24-$\mu$m height of the cell of FIG. 4, and even than the 3.6-$\mu$m height of a cell with one word line per row according to a topology similar to that of FIG. 4. Several factors take part in the height gain, especially: the putting in common of metal strips 31, 32, 46, 47 with the adjacent memory cells of the same column; the vertical arrangement of the transistors which enables placing in quincunx, along the vertical direction, contacts 48, 50 and vias 49, 51 associated with the gates of transistors M1 and M2 with respect to the contacts associated with the sources and drains of the same transistors; and the arrangement of the word lines on the third metal level, which enables running of four word lines without modifying the memory cell height, whereby the presence of the word lines is not a limiting factor for the memory cell height, conversely to the topology of FIG. 4 where each addition of a word line accordingly increases the memory cell height.

It should also be noted that the arrangement of sources SNI1 and SNI2 of N-channel MOS transistors NI1 and NI2 along a same lateral edge enables having one supply line GND only connected to the two N-channel MOS transistors NI1 and NI2, conversely to the memory cell of FIG. 4 which comprises two supply lines GND, each connected to a single one of N-channel MOS transistors NI1 and NI2. Any offset problem which could occur between the two supply lines GND is thus avoided.

Further, supply line VDD which would be horizontal on the memory cell of FIG. 4 is vertical in the present invention. Thus, when a memory cell is selected by a word line, supply line VDD supplies this memory cell only instead of supplying all the memory cells in the row having also been selected by the word line, thus avoiding a drop in the power supply by consumption peaks, which can adversely affect the reading from or the writing into a memory point, and may even cause a loss of the information memorized in the memory point in a reading.

A memory cell surface area of 7.43 $\mu$m$^2$, that is, 34% less than the 11.32-$\mu$m$^2$ surface area of the memory cell of FIG. 4 with four words per row, and even 4% less than a memory cell with one word line or row of topology similar to that of FIG. 4 is thus obtained. The present invention thus enables keeping a surface of the same order without adding an additional metallization level to form the electric circuit, and thus without increasing the manufacturing cost and difficulties as compared to prior art.

Of course, the present invention is likely to have various alterations, modifications, and improvements which will readily occur to those skilled in the art. Thus, P-channel MOS transistors PI1 and PI2, shown vertically in FIGS. 6 and 11, could be arranged horizontally so that their respective sources are put in common with the P-channel transistors of the memory cell of the same row located to the right of the shown cell. Further, the forming of the memory cell has been described as implementing one polysilicon level and three metallization levels. It is quite possible to replace the metal strips of one or several metallization levels with another conductive material. For example, the first metallization level may be replaced with a level two of doped polysilicon. Further, the memory point switches may be formed with P-channel MOS transistors, making the necessary adaptations. Further, those skilled in the art will know how to adapt the present invention to any exiting type of memory, such as a random access memory with memory cells having one bit line, a double or multiple access random access memory (DPRAM), a content-addressing memory (CAM), a dynamic random access memory (DRAM), or a ROM.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory block comprising a network of memory cell rows and columns, each memory cell being connected to a word line (WL00, WL01, WL02, WL03) and two substantially linear bit lines (BL0, $\overline{\text{BL0}}$), in which at least two word lines are associated with each row, and at least two adjacent columns share the two bit lines, two memory cells of the two adjacent columns belonging to a same row being connected to different word lines.

2. The memory block of claim 1, wherein the memory cells are formed in a semiconductor substrate, and comprise transistors (M1, M2, NI1, NI2, PI1, PI2 ), the gates (GM1, GM2, GNI1, GNI2, GPI1, GPI2 of which correspond to a same polysilicon level and the interconnections of which are fo ed by conductive strips distributed on three levels, the conductive strips forming the word lines (WL00, WL01, WL02, WL03) being of level three, and a conductive strip forming a bit line (BL0, $\overline{\text{BL0}}$) being of level two.

3. The memory block of claim 2, wherein each memory cell, arranged between two other memory cells of the same row, is connected to two supply lines (VDD, GND) of different voltages, each supply line being shared between the memory cell and one of the adjacent memory cells, and placed on a common edge between the two memory cells.

4. The memory block of claim 3, wherein the supply lines (VDD, GND) are of level two, parallel to the bit line (BL0, $\overline{\text{BL0}}$), and orthogonal to the word lines (WL00, WL01, WL02, WL03).

5. The memory block of claim 2, wherein each memory cell, arranged between two other memory cells of the same row, comprises four N-channel MOS transistors (M1, M2, NI1, NI2) having their sources (SM1, SM2, SNI1, SNI2) and drains (DM1, DM2, DNI1, DNI2) formed in a same active area and aligned along a common edge between the memory cell and one of the adjacent memory cells.

6. The memory block of claim 2, wherein each memory cell, arranged between two other memory cells of the same row, comprises two P-channel MOS transistors (PI1, PI2) having their sources (SPI1, SPI2) and drains (DPI1, DPI2) aligned along a common edge between the memory cell and one of the adjacent memory cells.

7. The memory block of claim 2, wherein the memory cells comprise a conductive strip (30) of level two, perpendicular to the word lines (WL00, WL01, WL02, WL03), connected to one of the word lines (WL00, WL01, WL02, WL03) and to two MOS transistors (M1, M2).

8. The memory block of claim 2, wherein each memory cell comprises a transistor (M1, M2) connected to the bit line (BLO, $\overline{BLO}$), and a metal strip (31, 32, 46, 47) of level one connecting a transistor (M1, M2) to a bit line (BLO, $\overline{BLO}$) located on an adjacent cell of the same row.

9. The memory block of claim 3, wherein each cell, arranged between the two other memory cells of the same column, comprises a metal strip (31, 32, 46, 47) of level one, connecting a transistor (M1, M2, PI1, PI2) to a supply line (VDD) or to a bit line (BLO, $\overline{BLO}$), the metal strip being shared between the memory cell and one of the adjacent memory cells, and placed on a common edge between the two memory cells.

10. The memory block of claim 6, wherein at least one memory cell comprises a conductive strip of level two (GBL0, $\overline{GBL0}$), parallel to the bit line (BLO, $\overline{BLO}$) and located above the P-channel MOS transistors (PI1, PI2).

11. A memory formed of a network of rows and columns of memory blocks defined according to claim 1, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

12. A memory formed of a network of rows and columns of memory blocks defined according to claim 2, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

13. A memory formed of a network of rows and columns of memory blocks defined according to claim 3, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

14. A memory formed of a network of rows and columns of memory blocks defined according to claim 4, wherein the word lines associated with memory cell rows of memory blocks of a same memory block row are common, and wherein the bit lines associated with memory cell columns of memory blocks of a same memory block column are separate, and comprising, per memory block colunm, at least one additional bit line extending in the column direction and being likely to be connected to one of the adjacent bit lines.

15. A memory formed of a network of rows and columns of memory blocks defined according to claim 5, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

16. A memory formed of a network of rows and columns of memory blocks defined according to claim 6, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

17. A memory formed of a network of rows and columns of memory blocks defined according to claim 7, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

18. A memory formed of a network of rows and columns of memory blocks defined according to claim 8, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

19. A memory formed of a network of rows and columns of memory blocks defined according to claim 9, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

20. A memory formed of a network of rows and columns of memory blocks defined according to claim 10, wherein the word lines associated with memory cell rows of memory blocks of a same memory block row are common, and wherein the bit lines associated with memory cell columns of memory blocks of a same memory block column are separate, and comprising, per memory block column, at least one additional bit line extending in the column direction and being likely to be connected to one of the adjacent bit lines.

* * * * *